United States Patent
Yu et al.

(10) Patent No.: US 8,482,987 B2
(45) Date of Patent: Jul. 9, 2013

(54) METHOD AND APPARATUS FOR THE ERASE SUSPEND OPERATION

(75) Inventors: Chuan-Ying Yu, Zhubei (TW); Ken-Hui Chen, Hsinchu (TW); Chun-Hsiung Hung, Hsinchu (TW); Kuen-Long Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 273 days.

(21) Appl. No.: 12/875,003

(22) Filed: Sep. 2, 2010

(65) Prior Publication Data

US 2012/0057410 A1 Mar. 8, 2012

(51) Int. Cl.
*G11C 16/04* (2006.01)

(52) U.S. Cl.
USPC ............ 365/185.29; 365/185.11; 365/185.3; 365/185.18

(58) Field of Classification Search
USPC .............. 365/185.29, 185.11, 185.3, 185.18
See application file for complete search history.

(56) References Cited

U.S. PATENT DOCUMENTS

| | | | |
|---|---|---|---|
| 5,341,330 A | 8/1994 | Wells et al. | |
| 5,805,501 A | 9/1998 | Shiau et al. | |
| 6,252,803 B1 | 6/2001 | Fastow et al. | |
| 6,483,752 B2 | 11/2002 | Hirano | |
| 7,180,781 B2 | 2/2007 | Abedifard et al. | |
| 7,266,019 B2 | 9/2007 | Taoka et al. | |
| 7,463,525 B2 | 12/2008 | Zheng et al. | |
| 7,489,560 B2 | 2/2009 | Chang et al. | |
| 7,630,253 B2 | 12/2009 | Melik-Martirosian et al. | |
| 7,649,782 B2 | 1/2010 | Eguchi et al. | |
| 7,697,341 B2 | 4/2010 | Cha et al. | |
| 8,130,550 B1* | 3/2012 | Confalonieri | 365/185.11 |
| 2005/0099857 A1 | 5/2005 | Yuan et al. | |
| 2007/0140015 A1* | 6/2007 | Kawamura | 365/185.22 |
| 2007/0242519 A1* | 10/2007 | Ito et al. | 365/185.22 |
| 2008/0144389 A1 | 6/2008 | Chen et al. | |
| 2009/0290423 A1 | 11/2009 | Kim et al. | |
| 2010/0128525 A1 | 5/2010 | Mokhlesi | |
| 2011/0273936 A1* | 11/2011 | Yu et al. | 365/185.33 |

FOREIGN PATENT DOCUMENTS

| | | |
|---|---|---|
| WO | 9744792 A1 | 11/1997 |
| WO | 02067268 A1 | 8/2002 |

\* cited by examiner

*Primary Examiner* — Toan Le
(74) *Attorney, Agent, or Firm* — Kenta Suzue; Haynes Beffel & Wolfeld LLP

(57) ABSTRACT

Various aspects of a nonvolatile memory have an improved erase suspend procedure. A bias arrangement is applied to word lines of an erase sector undergoing an erase procedure interrupted by an erase suspend procedure. As a result, another operation performed during erase suspend, such as a read operation or program operation, has more accurate results due to decreased leakage current from any over-erased nonvolatile memory cells of the erase sector.

20 Claims, 6 Drawing Sheets

METHOD AND APPARATUS FOR THE ERASE SUSPEND OPERATION

BACKGROUND

Description of Related Art

In a memory integrated circuit, once an erase operation is initiated, several erase phases follow: a pre-programming phase, an erase phase, and a soft programming phase. Although a purpose of these multiple erase phases is to repair over-erased memory cells, the resulting multi-phase erase operation is time-consuming.

For some applications, a memory accepts an erase suspend command even during an erase operation. An example of the erase suspend command implementation during an erase operation is discussed in U.S. Pat. No. 5,805,501, incorporated by reference.

Once an erase suspend command is received, control is taken over by a new command in 20 μs. The new command is valid in sectors not undergoing the suspended erase. However, current leakage is a problem after the 20 us while performing the new command.

In serial flash, a small sector of approximately 4 kB, is the erase unit. However, a well or bit line is shared by a quantity of memory cells are larger than approximately 4 kB, for example, approximately 64 kB or approximately 128 kB. Current leakage from over-erased memory cells in the 4 kB erase sector will affect the other approximately 64 kB or approximately 128 kB which share the same well or bit line. So, if the erase suspend operation is performed in the erase operation during the erase phase or the soft program phase, the following read or program command will suffer from current leakage of the over-erased memory cells in the 4 kB erase sector.

SUMMARY

One aspect is an apparatus comprising a memory array of an integrated circuit, a plurality of word lines, and control logic of the integrated circuit.

The memory array includes a plurality of erase sectors of nonvolatile memory cells. The plurality of word lines accesses the nonvolatile memory cells.

The control logic is responsive to an erase command by performing a multi-phase erase procedure on an erase sector of the plurality of erase sectors of the memory array.

The control logic is responsive to an erase suspend command by performing an erase suspend procedure suspending the multi-phase erase procedure and allowing a non-erase command to perform a non-erase procedure on the memory array. The erase suspend procedure applies a bias arrangement to at least one of the plurality of word lines accessing the erase sector during the non-erase procedure. The bias arrangement decreases leakage from over-erased nonvolatile memory cells of the erase sector.

In one embodiment, the erase suspend procedure applies the bias arrangement, responsive to the erase suspend procedure suspending the multi-phase erase procedure when the multi-phase erase procedure is in an erase phase.

In one embodiment, the erase suspend procedure applies the bias arrangement, responsive to the erase suspend procedure suspending the multi-phase erase procedure when the multi-phase erase procedure is in a soft program phase after an erase phase.

In one embodiment, the erase suspend procedure does not apply the bias arrangement, responsive to the erase suspend procedure suspending the multi-phase erase procedure when the multi-phase erase procedure is in a pre-program phase before an erase phase.

In one embodiment, the erase suspend procedure does not apply the bias arrangement, responsive to the erase suspend procedure suspending the multi-phase erase procedure when the multi-phase erase procedure is in a verify phase.

In one embodiment, the non-erase command is a read command and the non-erase procedure is a read procedure.

In one embodiment, the non-erase command is a program command and the non-erase procedure is a program procedure.

In one embodiment, the non-erase command is a program command and the non-erase procedure is a program procedure including a program verify phase, and the erase suspend procedure applies the bias arrangement during the program verify phase.

In one embodiment, the non-erase procedure is performed on a selected memory cell sharing a same well with at least one of the over-erased nonvolatile memory cells of the erase sector.

In one embodiment, the non-erase procedure is performed on a selected memory cell sharing a same bit line with at least one of the over-erased nonvolatile memory cells of the erase sector.

Another aspect is method, comprising:
performing an erase suspend procedure on a memory array of the integrated circuit, by suspending a multi-phase erase procedure of an erase sector of the memory array;
performing a non-erase procedure on the memory array; and
applying a bias arrangement to at least one word line accessing the erase sector during the non-erase procedure, the bias arrangement decreasing leakage from over-erased nonvolatile memory cells of the erase sector.

Various embodiments are described herein.

DETAILED DESCRIPTION

Figure 1:
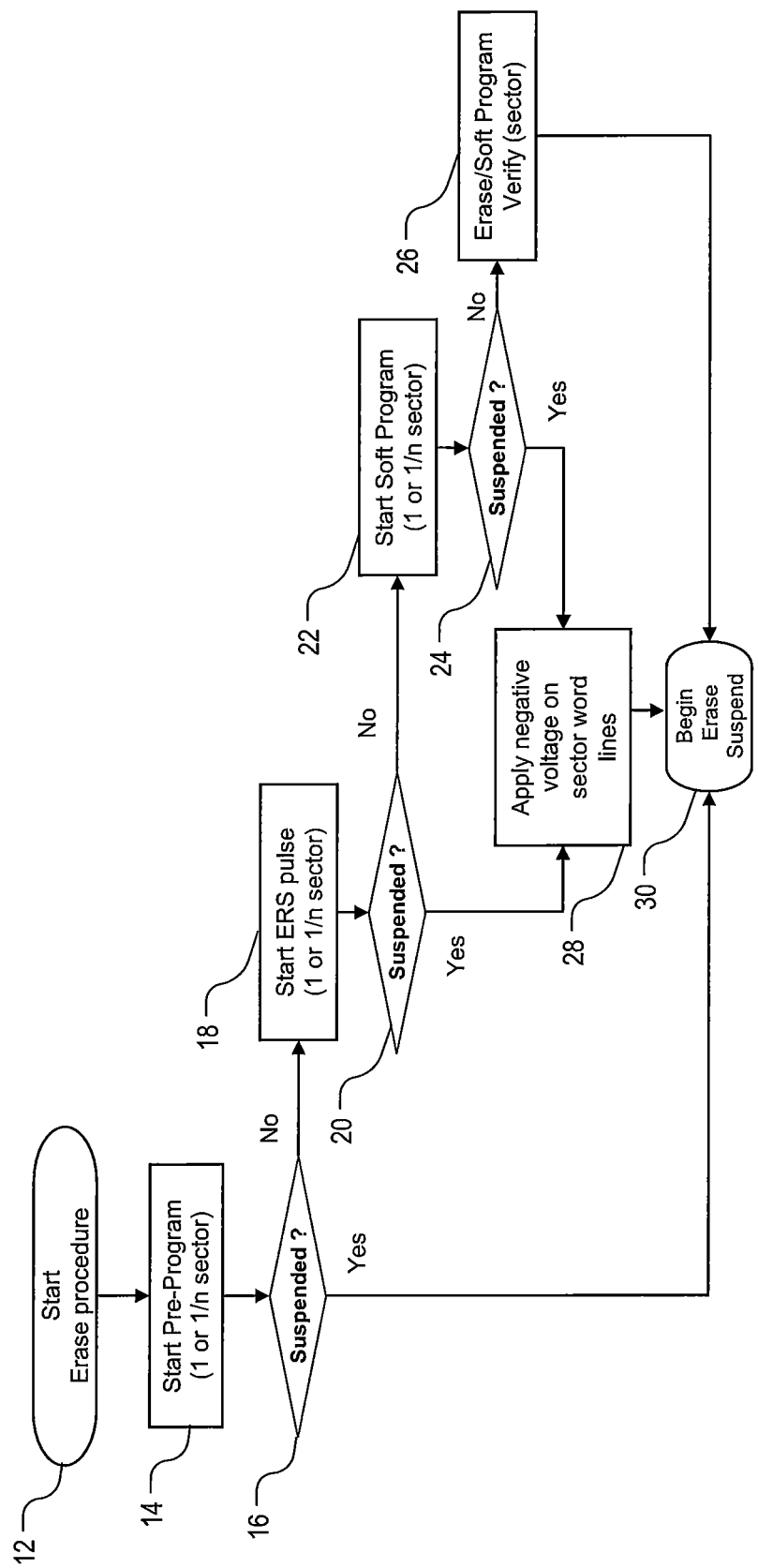
FIG. 1 is a simplified flowchart diagram of an erase procedure with an improved erase suspend procedure, that applies negative voltage on the word lines of a sector undergoing erase, as part of switching from an erase procedure to an erase suspend procedure.

FIG. 1 is a simplified flowchart diagram of an erase procedure with an improved erase suspend procedure, that applies negative voltage on the word lines of a sector undergoing erase, as part of switching from an erase procedure to an erase suspend procedure.

In response to the integrated circuit receiving an erase command (such as an erase command operation code and a sector address), the erase procedure starts 12. The erase procedure has multiple phases, including a pre-program phase 14, an erase phase 18, a soft program phase 22, and a verify phase 26.

During the pre-program phase, memory cells in an erase sector undergoing erase, are programmed to approximately the same level. This avoids having some cells that were either un-programmed or that have lost charge during normal operations, to be over-erased during the erase procedure. Because all the memory cells in an erase sector are erased as a block, all memory cells receive the same erase pulse during the erase phase, regardless of their individual charge state.

During the erase phase, all of the memory cells in the erase sector undergoing erase, are given an erase pulse. In one embodiment with floating gate nonvolatile memory, the program procedure adds electrons to the floating gate, and the erase pulse removes electrons from the floating gate. Other embodiments include charge trapping nonvolatile memory.

During the soft program phase, memory cells are identified whose threshold voltages are below a pre-determined minimum value. Such memory cells receive a soft programming pulse. This repeats until all memory cells in the erase sector have their threshold voltages brought to above the pre-determined minimum value.

During the verify phase, all of the memory cells undergo verification to confirm adequate threshold voltage. Such verification can occur at different phases of the procedure. In response to verify failure, the failing phase is repeated, or the erase procedure is repeated.

Erase suspend is a useful operation that prevents a user from waiting for long periods for the complete erase procedure to finish. However, because the erase procedure is suspended prior to completion of the erase procedure, the memory cells undergoing erase may have been over-erased, with the accompanying problem of current leakage. Current leakage from over-erased memory cells can distort the result of a program operation or read operation that is performed during the erase suspend period. For example, current leakage from over-erase memory cells will increase the apparent current flow from a memory cell undergoing a program operation or read operation, in the event that the substrate or bit line is shared with the over-erased memory cell.

After each of the phases, there is an option to perform erase suspend. During the pre-program phase 14, if there is an erase suspend 16, then erase suspend begins 30. Otherwise, the erase procedure continues with the erase phase 18. During the erase phase 18, if there is an erase suspend 20, then negative voltage is applied on the word lines of the erase sector undergoing erase 28, and then erase suspend begins 30. Otherwise, the erase procedure continues with the soft program phase 22. During the soft program phase 22, if there is an erase suspend 24, then negative voltage is applied on the word lines of the erase sector undergoing erase 28, and then erase suspend begins 30. Otherwise, the erase procedure continues with the verify phase 26. During the verify phase 26, if there is an erase suspend 24, then erase suspend begins 30. Otherwise, the erase procedure completes.

When accepting an erase suspend command in the erase phase or the soft-program phase of a multi-phase erase procedure, a negative voltage is applied on all word lines of the sector or small sector to eliminate the leakage of over-erased memory cells. In the erase phase, over-erase can occur, and in the soft-program phase, fixing an over-erased memory cell may be incomplete. The step of applying negative voltage to the world lines can be finished in 20 μs, which can meet the required timing for a suspend command to be performed and defer to a new command such as a program command or read command.

For those over-erased memory cells whose threshold voltage is less then 0 V, a background leakage current is induced, making the read operation or program verify phase of a program operation fail. Adding negative voltage on word lines can turn off the channel and eliminate the background leakage. So, a read operation and program verify phase of a program operation can pass, even though the object memory cell of the read operation or program verify phase of a program operation shares the same bit line or well as the over-erased memory cells.

Figure 2:
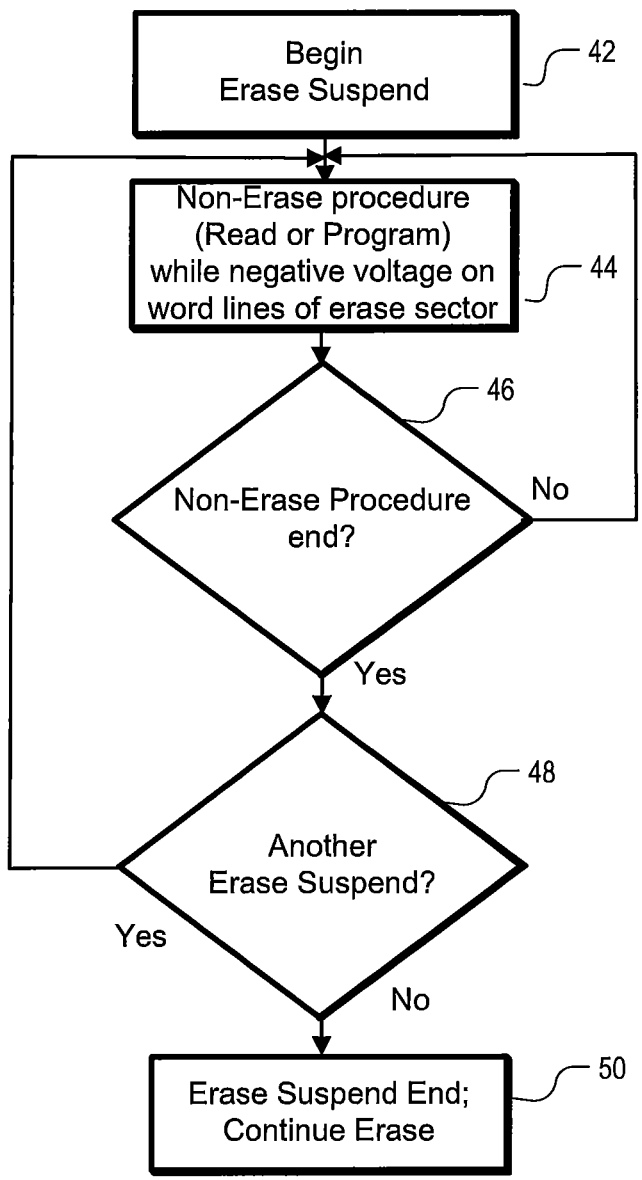
FIG. 2 is a simplified flowchart diagram of an improved erase suspend procedure, that applies negative voltage on the word lines of a sector undergoing erase, while performing a non-erase procedure during the erase suspend procedure.

FIG. 2 is a simplified flowchart diagram of an improved erase suspend procedure, that applies negative voltage on the word lines of a sector undergoing erase, while performing a non-erase procedure during the erase suspend procedure.

In 42, erase suspend begins. In 44, a non-erase procedure begins, such as a read operation or a program operation, while negative voltage is applied to word lines of the erase sector. In 46, if the non-erase procedures are not over, than another non-erase procedure is performed 44. Otherwise, the erase suspend procedure continues. In 48, if there is another erase suspend, then the erase suspend procedure loops back to 44. Otherwise, the erase suspend ends and the erase operation continues 50.

Figure 3:
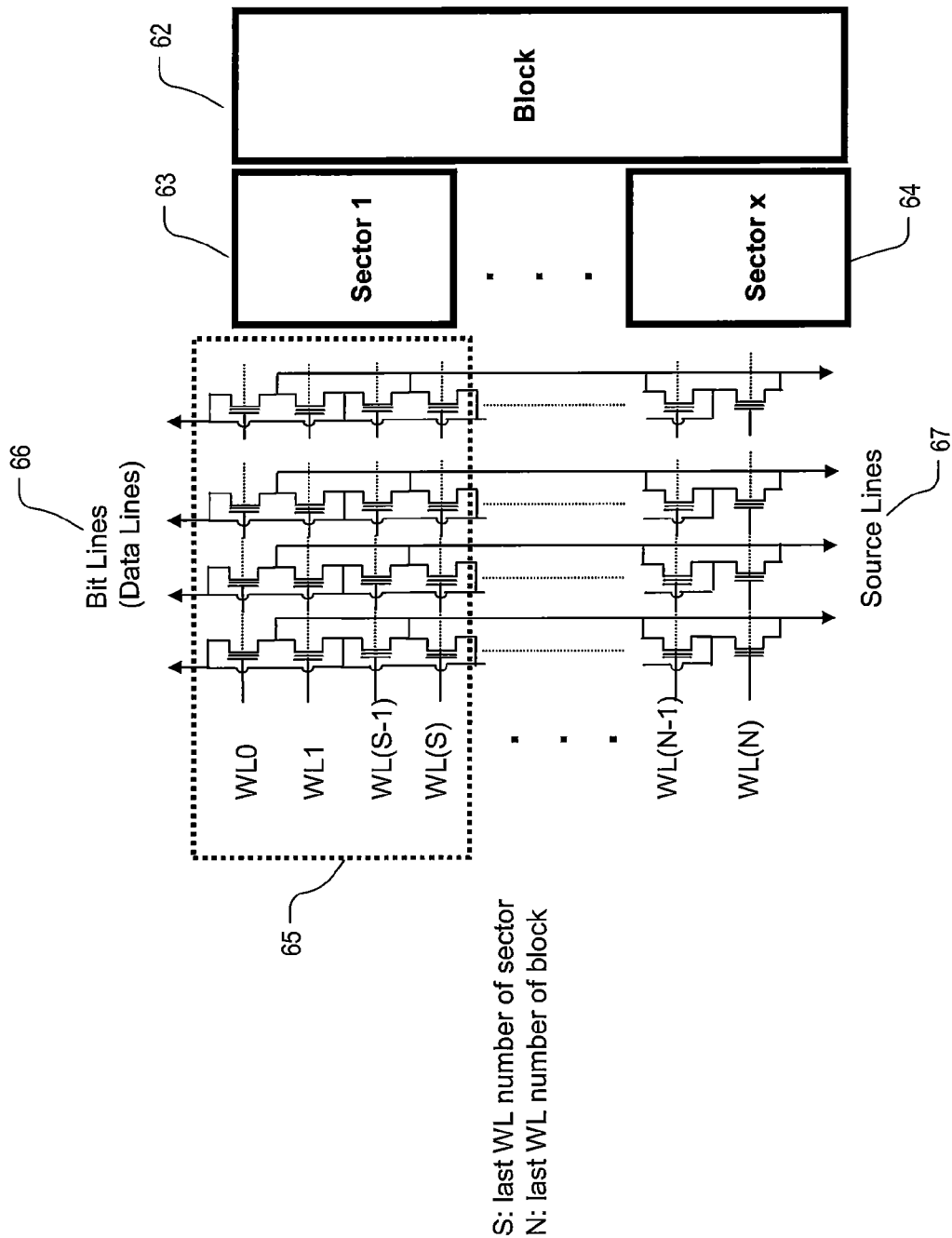
FIG. 3 is a simplified block diagram of an exemplary nonvolatile memory array that implements the improved erase suspend procedure.

FIG. 3 is a simplified block diagram of an exemplary nonvolatile memory array that implements the improved erase suspend procedure.

The memory cells in a block 62 are divided into a plurality of sectors 63 or a plurality of small sectors (N small sectors in one sector). Accordingly, the duration of an erase procedure for the sector will be smaller than the duration of an erase procedure for the entire block.

During an erase procedure, an erase sector selected to be erased, such as sector 1 63, shares a well or bit line 66 with another erase sector that is not selected to be erased, such as sector x 64. During the erase suspend, the word lines 65 of the erase sector receive a negative voltage to suppress current leakage from over-erased memory cells.

Figure 4:
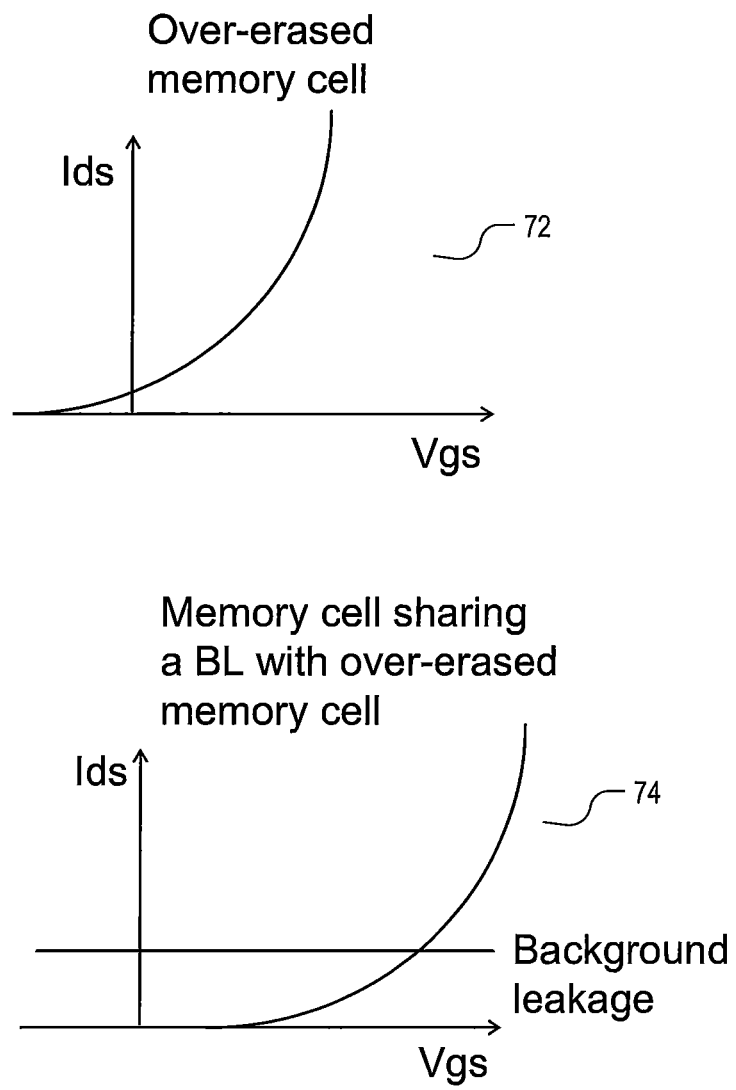
FIG. 4 shows multiple graphs, of (i) current versus voltage for an over-erased nonvolatile memory cell that causes leakage current, and (ii) another nonvolatile memory cell whose apparent state is distorted by the leakage current of the over-erased nonvolatile memory cell.

FIG. 4 shows multiple graphs, of (i) current versus voltage for an over-erased nonvolatile memory cell that causes leakage current, and (ii) another nonvolatile memory cell whose apparent state is distorted by the leakage current of the over-erased nonvolatile memory cell.

The over-erased memory cell has a threshold voltage less than 0V, and causes leakage current.

Another nonvolatile memory cell, which shares a bit line or well with the over-erased memory cell, undergoes a read operation or a program operation (including a program verify phase) IV curve. The apparent IV curve is the sum of the background current leakage of the over-erased memory cell, and its own actual current.

Figure 5:
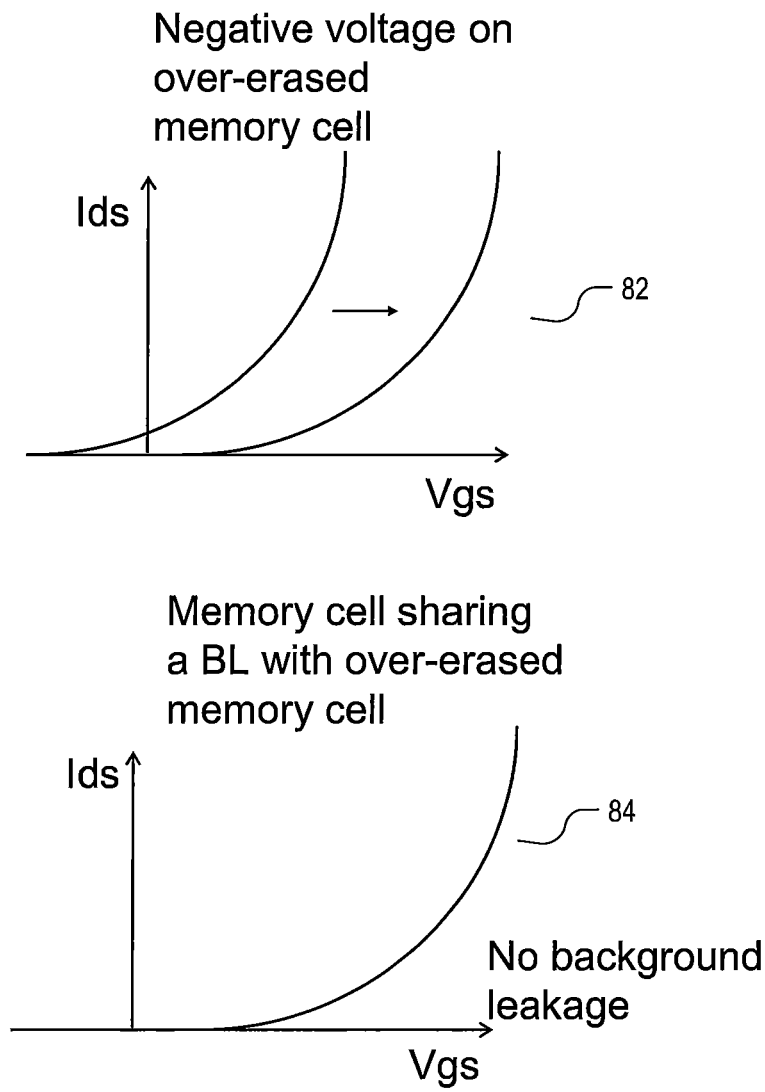
FIG. 5 shows multiple graphs, of (i) current versus voltage for an over-erased nonvolatile memory cell that no longer causes leakage current due to the negative voltage applied to word lines of a sector undergoing an erase procedure and then an erase suspend procedure, and (ii) another nonvolatile memory cell whose apparent state is no longer distorted by the leakage current of the over-erased nonvolatile memory cell.

FIG. 5 shows multiple graphs, of (i) current versus voltage for an over-erased nonvolatile memory cell that no longer causes leakage current due to the negative voltage applied to word lines of a sector undergoing an erase procedure and then an erase suspend procedure, and (ii) another nonvolatile memory cell whose apparent state is no longer distorted by the leakage current of the over-erased nonvolatile memory cell.

Because a negative voltage is applied on the over-erased memory cell, the apparent behavior of the threshold voltage is larger than 0V.

Another nonvolatile memory cell, which shares a bit line or well with the over-erased memory cell, undergoes a read operation or a program operation (including a program verify phase) IV curve. Because the over-erased memory cell is not causing background current leakage, the measured memory cell current is its own actual current.

Figure 6:
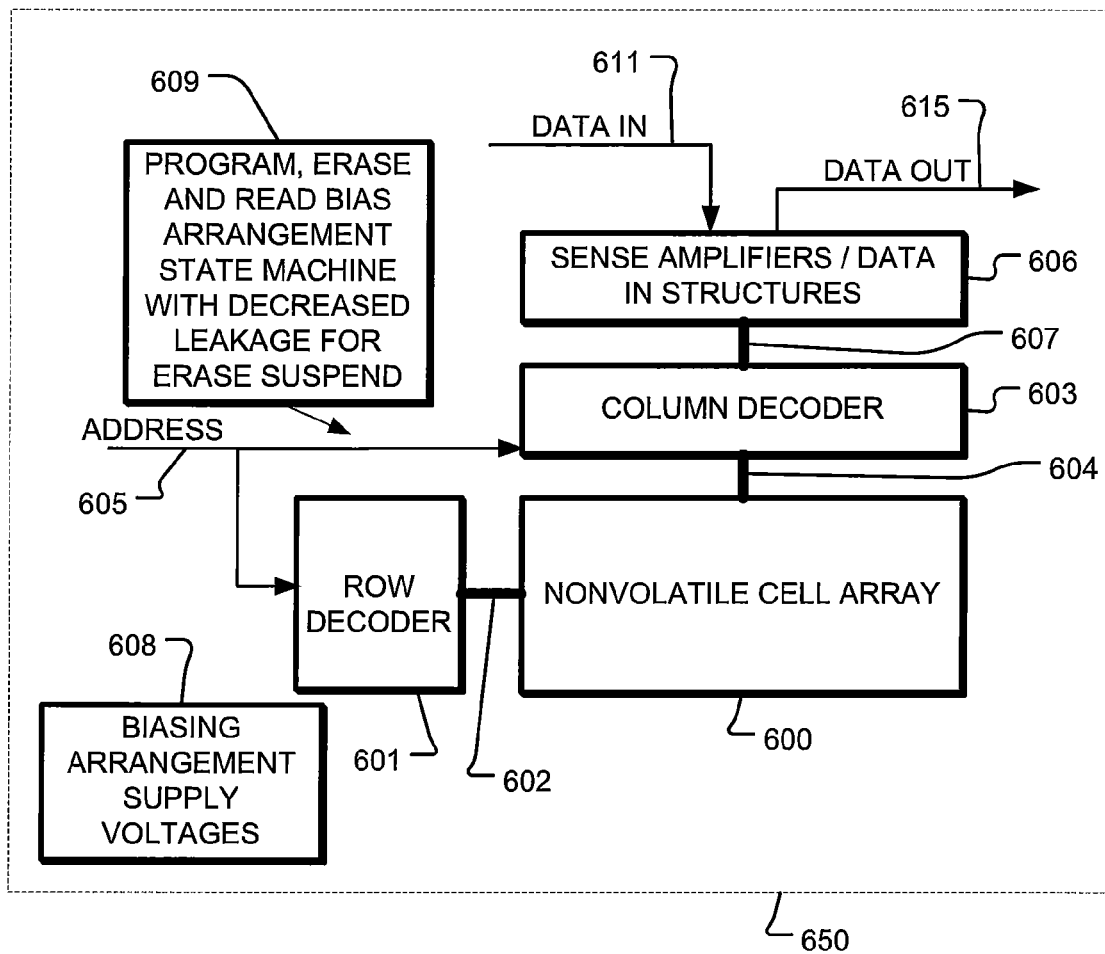
FIG. 6 is a block diagram of a memory integrated circuit with the improvements described herein.

FIG. 6 is a block diagram of a memory integrated circuit with the improvements described herein.

FIG. 6 is a simplified block diagram of an integrated circuit 650 including a memory array 600. A word line (or row) and block select decoder 601 is coupled to, and in electrical communication with, a plurality 602 of word lines and string select lines, and arranged along rows in the memory array 600. A bit line (column) decoder and drivers 603 are coupled to and in electrical communication with a plurality of bit lines 604 arranged along columns in the memory array 600 for reading data from, and writing data to, the memory cells in the memory array 600. Addresses are supplied on bus 605 to the word line decoder and drivers 601 and to the bit line decoder 603. Sense amplifiers and data-in structures in block 606, including current sources for the read, program and erase modes, are coupled to the bit line decoder 603 via the bus 607. Data is supplied via the data-in line 611 from input/output ports on the integrated circuit 650, to the data-in structures in block 606. Data is supplied via the data-out line 615 from the sense amplifiers in block 606 to input/output ports on the integrated circuit 650, or to other data destinations internal or external to the integrated circuit 650. Program, erase, and read bias arrangement state machine circuitry 609 implements the improved erase suspend procedure that applies a negative voltage to word lines of an erase sector undergoing an erase procedure, during an erase suspend procedure, and controls biasing arrangement supply voltages 608.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
a memory array of an integrated circuit, including a plurality of erase sectors of nonvolatile memory cells;
a plurality of word lines accessing the nonvolatile memory cells; and
control logic of the integrated circuit,
wherein the control logic is responsive to an erase command by performing a multi-phase erase procedure on an erase sector of the plurality of erase sectors of the memory array, and
wherein the control logic is responsive to an erase suspend command by performing an erase suspend procedure suspending the multi-phase erase procedure and allowing a non-erase command to perform a non-erase procedure on the memory array, and the erase suspend procedure applies a bias arrangement to at least one of the plurality of word lines accessing the erase sector during the non-erase procedure, the bias arrangement decreasing leakage from over-erased nonvolatile memory cells of the erase sector.

2. The apparatus of claim 1, wherein the erase suspend procedure applies the bias arrangement, responsive to the erase suspend procedure suspending the multi-phase erase procedure when the multi-phase erase procedure is in an erase phase.

3. The apparatus of claim 1, wherein the erase suspend procedure applies the bias arrangement, responsive to the erase suspend procedure suspending the multi-phase erase procedure when the multi-phase erase procedure is in a soft program phase after an erase phase.

4. The apparatus of claim 1, wherein the erase suspend procedure does not apply the bias arrangement, responsive to the erase suspend procedure suspending the multi-phase erase procedure when the multi-phase erase procedure is in a pre-program phase before an erase phase.

5. The apparatus of claim 1, wherein the erase suspend procedure does not apply the bias arrangement, responsive to the erase suspend procedure suspending the multi-phase erase procedure when the multi-phase erase procedure is in a verify phase.

6. The apparatus of claim 1, wherein the non-erase command is a read command and the non-erase procedure is a read procedure.

7. The apparatus of claim 1, wherein the non-erase command is a program command and the non-erase procedure is a program procedure.

8. The apparatus of claim 1, wherein the non-erase command is a program command and the non-erase procedure is a program procedure including a program verify phase, and the erase suspend procedure applies the bias arrangement during the program verify phase.

9. The apparatus of claim 1, wherein the non-erase procedure is performed on a selected memory cell sharing a same well with at least one of the over-erased nonvolatile memory cells of the erase sector.

10. The apparatus of claim 1, wherein the non-erase procedure is performed on a selected memory cell sharing a same bit line with at least one of the over-erased nonvolatile memory cells of the erase sector.

11. A method, comprising:
performing an erase suspend procedure on a memory array of the integrated circuit, by suspending a multi-phase erase procedure of an erase sector of the memory array;
performing a non-erase procedure on the memory array; and
applying a bias arrangement to at least one word line accessing the erase sector during the non-erase procedure, the bias arrangement decreasing leakage from over-erased nonvolatile memory cells of the erase sector.

12. The method of claim 11, wherein the erase suspend procedure applies the bias arrangement, responsive to the erase suspend procedure suspending the multi-phase erase procedure when the multi-phase erase procedure is in an erase phase.

13. The method of claim 11, wherein the erase suspend procedure applies the bias arrangement, responsive to the erase suspend procedure suspending the multi-phase erase procedure when the multi-phase erase procedure is in a soft program phase after an erase phase.

14. The method of claim 11, wherein the erase suspend procedure does not apply the bias arrangement, responsive to the erase suspend procedure suspending the multi-phase erase procedure when the multi-phase erase procedure is in a pre-program phase before an erase phase.

15. The method of claim 11, wherein the erase suspend procedure does not apply the bias arrangement, responsive to the erase suspend procedure suspending the multi-phase erase procedure when the multi-phase erase procedure is in a verify phase.

16. The method of claim 11, wherein the non-erase command is a read command and the non-erase procedure is a read procedure.

17. The method of claim 11, wherein the non-erase command is a program command and the non-erase procedure is a program procedure.

18. The method of claim 11, wherein the non-erase command is a program command and the non-erase procedure is a program procedure including a program verify phase, and the erase suspend procedure applies the bias arrangement during the program verify phase.

19. The method of claim 11, wherein the non-erase procedure is performed on a selected memory cell sharing a same well with at least one of the over-erased nonvolatile memory cells of the erase sector.

20. The method of claim 11, wherein the non-erase procedure is performed on a selected memory cell sharing a same bit line with at least one of the over-erased nonvolatile memory cells of the erase sector.

* * * * *